(12) United States Patent
Huebner et al.

(10) Patent No.: US 10,310,385 B2
(45) Date of Patent: Jun. 4, 2019

(54) OPTICAL SYSTEM FOR PRODUCING LITHOGRAPHIC STRUCTURES

(71) Applicant: Carl Zeiss AG, Oberkochen (DE)

(72) Inventors: Philipp Huebner, Hamburg (DE); Gerhard Krampert, Pleasanton, CA (US); Stefan Richter, Jena (DE); Timo Mappes, Karlsruhe (DE)

(73) Assignee: Carl Zeiss AG, Oberkochen (DE)

(*) Notice: Subject to any disclaimer, the term of this patent is extended or adjusted under 35 U.S.C. 154(b) by 0 days.

(21) Appl. No.: 15/994,068

(22) Filed: May 31, 2018

(65) Prior Publication Data

US 2018/0275528 A1    Sep. 27, 2018

Related U.S. Application Data

(60) Division of application No. 15/478,709, filed on Apr. 4, 2017, now Pat. No. 9,989,862, which is a continuation of application No. PCT/EP2015/071709, filed on Sep. 22, 2015.

(30) Foreign Application Priority Data

Oct. 6, 2014  (DE) .................. 10 2014 220 168

(51) Int. Cl.
*G03F 7/20* (2006.01)
*G03F 9/00* (2006.01)

(52) U.S. Cl.
CPC ...... *G03F 7/70383* (2013.01); *G03F 7/70683* (2013.01); *G03F 9/7007* (2013.01); *G03F 9/7011* (2013.01)

(58) Field of Classification Search
CPC ..... G03F 7/70; G03F 7/70383; G03F 7/70683
USPC ............................... 355/53, 67, 77
See application file for complete search history.

(56) References Cited

U.S. PATENT DOCUMENTS

| 4,645,924 A | 2/1987 | Suzuki |
| 6,416,912 B1 * | 7/2002 | Kobayashi ............ G03F 9/7076 430/22 |
| 9,989,862 B2 | 6/2018 | Huebner et al. |
| 2004/0257572 A1 | 12/2004 | Stacker |
| 2008/0112609 A1 | 5/2008 | Inoue |
| 2011/0181856 A1 | 7/2011 | Lee et al. |
| 2013/0221550 A1 | 8/2013 | Koos et al. |
| 2013/0223788 A1 | 8/2013 | Koos et al. |
| 2017/0205715 A1 | 7/2017 | Huebner et al. |

FOREIGN PATENT DOCUMENTS

| CN | 101178545 A | 5/2008 |
| DE | 103 15 086 A1 | 10/2004 |

OTHER PUBLICATIONS

International Search Report for corresponding PCT Appl No. PCT/EP2015/071709, dated Jan. 25, 2016.
(Continued)

*Primary Examiner* — Hung Nguyen
(74) *Attorney, Agent, or Firm* — Fish & Richardson P.C.

(57) ABSTRACT

An optical system for producing lithographic structures is disclosed. Also disclosed is a method for determining relative coordinates of a position of a writing field relative to a position of a preview field in such an optical system, and a method for producing lithographic structures using such an optical system.

20 Claims, 2 Drawing Sheets

(56) References Cited

OTHER PUBLICATIONS

German Office Action, with translation thereof, for corresponding DE Appl No. 10 2014 220 168.3, dated Jun. 1, 2015.
Chinese office action and search report, with English translation therein, for corresponding CN Appl No. 201580054446.5, dated Apr. 16, 2018.

* cited by examiner

OPTICAL SYSTEM FOR PRODUCING LITHOGRAPHIC STRUCTURES

CROSS-REFERENCE TO RELATED APPLICATIONS

The present application is a divisional application of U.S. application Ser. No. 15/478,709, filed Apr. 4, 2017, now U.S. Pat. No. 9,989,862, which is a continuation of, and claims benefit under 35 U.S.C. 120 to, international application PCT/EP2015/071709, filed Sep. 22, 2015, which claims benefit under 35 U.S.C. 119 of German Application No. DE 10 2014 220 168.3, filed Oct. 6, 2014. The entire disclosure of U.S. application Ser. No. 15/478,709 and international application PCT/EP2015/071709 are incorporated by reference herein.

FIELD

The disclosure relates to an optical system for producing lithographic structures. Further, the disclosure relates to a method for determining relative coordinates of a position of a writing field relative to a position of a preview field in such an optical system, and a method for producing lithographic structures using such an optical system.

BACKGROUND

An optical system of the type set forth at the outset is known from U.S. 2013/0 221 550 A1 and U.S. 2013/0 223 788 A1. DE 103 15 086 A1 has disclosed a method and an apparatus for aligning semiconductor wafers when producing semiconductors. The lithography apparatus disclosed therein includes an exposure unit, a first optical measuring device including an alignment microscope, and a further stray radiation measuring device. In this lithography apparatus, a wafer holder is arranged on a positioning device.

SUMMARY

The disclosure seeks to develop such an optical system such that positioning of a substrate, which is processed while producing lithographic structures, may be achieved, in particular, with a good target accuracy. In particular, this should facilitate finding, on a very large substrate area relative to the structure dimension, a position for a structure to be produced which is as exact as possible since the writing field regularly only offers a very small section of an entire substrate area on which a desired structure should be produced with positional accuracy.

In one aspect, the disclosure provides an optical system for producing lithographic structures. The optical system includes a projection optical unit for guiding a structure-producing writing light beam into a writing focus in the region of a substrate surface in a substrate plane. The optical system also includes a deflection device for deflecting the writing focus of the writing light beam within a writing field in the region of the substrate surface. The optical system further includes a preview optical unit for imaging a preview field in the region of the substrate surface, wherein the preview field has an area which is greater than an area of the writing field by at least a factor of 10, and the projection optical unit and the preview optical unit are carried by a common frame. In addition, the optical system includes a substrate holder which is displaceable in a plane parallel to the substrate surface with two degrees of translational freedom. Also, the optical system includes a control unit that includes a memory, in which relative coordinates of a position of the writing field relative to the position of the preview field are stored.

According to the disclosure, it was recognized that positioning the substrate to be structured in such a way that the structure to be produced is produced in a writing target position is improved if stored relative coordinates which specify the position of the writing field relative to the position of a preview field are utilized. This takes account of the fact that the writing field is regularly very small, with use being made of a preview field which, in relation thereto, is much larger. The preview field in turn regularly only covers a small part of an overall substrate surface on which the structure should be produced with an accurate position. Then, the writing field may be optimized for the structure-producing process and may, in particular, have a very small embodiment. A typical size of the preview field is 10×10 mm$^2$. A typical size of the writing field is 400×400 µm$^2$. The preview field may be larger than the writing field by a factor of 50, by a factor of 100 or else by an even larger factor, for example by a factor of 1000 or else 10 000. The overall substrate surface has a typical size of 20×20 cm$^2$. This value applies to a rectangular substrate. A typical round substrate has an area corresponding to approximately 75% of the area of the rectangular substrate. The writing focus has a typical area of approximately 1 µm$^2$.

By using relative coordinates, it is possible to ensure a high throughput when producing structures. It is possible to produce microstructures and/or nanostructures. Mask-free or mask-based lithography may be used during the production of lithographic structures using the optical system. The preview optical unit may image the preview field with a magnification in the range between 5 and 100, for example in the range between 30 and 40.

For the purposes of capturing the preview field, the optical system may include a digital camera, which may be embodied as a CCD camera.

Single photon lithography or multiphoton lithography may be used for producing structures.

The optical system can include a process camera for capturing the writing field using the beam path of the writing light beam in the projection optical unit. Such a process camera may be used to determine the relative coordinates of the position of the writing field relative to the position of the preview field. The process camera may include a chip for the spatially resolved capture of the writing field. Here, this may be a CCD chip or else a CMOS camera. The writing field may be illuminated by a writing field illumination which is independent of the writing light beam. The writing field may be illuminated by a wide-field illumination. A light source for the writing field illumination may be embodied as an LED. Capturing both independent light for illuminating the writing field and the writing light by way of the process camera is advantageous since this permits an observation of a writing process and/or conclusions to be drawn about a performed structure formation, in particular about a performed polymerization. The writing light and/or independent light for illuminating the writing field may be coupled into the process camera by way of a beam splitter, in particular by way of a partly transmissive mirror.

The projection optical unit can be displaceable relative to the preview optical unit in a direction perpendicular to the substrate plane. With such displaceability, it is possible to facilitate adjusting focal planes of the projection optical unit on the one hand relative to the preview optical unit on the other hand. The displacement may be carried out with the aid of an appropriate displacement drive. The preview optical unit and/or the projection optical unit may have a displaceable embodiment in the direction perpendicular to the substrate plane.

The optical system can include an autofocusing device for determining a focal plane of the projection optical unit and/or of the preview optical unit. An ideal focal position of the projection optical unit and/or of the preview optical unit may be determined with the aid of such an autofocusing device. The autofocusing device may have an illumination that is independent of the writing light or of the preview light.

The projection optical unit can have an image-side numerical aperture which is greater than 1.0, and/or the preview optical unit can have an image-side numerical aperture which is less than 0.1. Such image-side numerical apertures were found to be particularly suitable for the function of the projection optical unit on the one hand and for the function of the preview optical unit on the other hand. By way of example, the image-side numerical aperture of the preview optical unit may be 0.05.

The optical system can include a light source for producing writing light. Such a light source may be a pulsed light source. The light source of the writing light may be an NIR laser. The light source of the writing light may be an ultrashort pulse laser light source. A light source which is separate from the light source of the writing light and which may likewise be part of the optical system may be used for the preview optical unit. In the case where the writing field on the one hand and the preview field on the other hand do not overlap, use is regularly made of an illumination for the preview optical unit which is independent of the light source for the writing light.

In one aspect, the disclosure provides a method for determining relative coordinates of a position of a writing field relative to a position of a preview field in an optical system disclosed herein. The method includes recording a test object using one of the two optical units from the optical group: preview optical unit and projection optical unit in an initial field, namely in one of the two fields from the field group: preview field and writing field. The method also includes positioning the test object in the initial field such that the test object has a defined position in the initial field. The method further includes carrying out, by way of the substrate holder, a coarse displacement of the test object between the initial field and a target field, namely the other of the two fields from the field group. In addition, the method includes registering coarse relative coordinates of this coarse displacement, and recording the test object using the other of the two optical units from the optical group. Also, the method includes finely positioning the test object in the target field such that the test object has a defined position in the target field, and registering changes in the coarse relative coordinates during the fine positioning and producing the relative coordinates from the coarse relative coordinates and the result of the registration. Such a method was found to be particularly efficient. Initially, the test object may be recorded in the preview field using the preview optical unit and subsequently the test object may be recorded in the writing field using the projection optical unit. A reverse sequence of the recordings is also possible.

A correlation of the position of the test object in the initial field on the one hand and in the target field on the other hand can be maximized during the fine positioning. Such fine positioning increases the accuracy when determining the relative coordinates. The test object may be rotated and/or compressed and/or displaced when maximizing the correlation. In addition to the fine positioning, checking of an interaction between the two optical units may also be checked and, if necessary, corrected when maximizing the correlation in this way. By way of example, the positions of focal planes of both optical units in relation to one another may be checked and, if necessary, corrected. It is also possible to monitor a predetermined imaging scale ratio of the two optical units.

An image stack can be produced during the test object recording by recording various images of the test object using the recording optical unit in various displacement positions of the recording optical unit relative to the test object in a displacement direction perpendicular to the substrate plane. Such an image stack recording increases an accuracy of determining the relative coordinates even along the coordinate perpendicular to the substrate plane. This improves positioning of the focus during the production of lithographic structures.

A coarse displacement of the test object between the fields of the field group can occur multiple times during the determination. With this approach, the relative coordinates may be determined within the scope of an iterative process. The coordinates are determined with an increased accuracy as a result thereof.

In one aspect, the disclosure provides a method for producing lithographic structures using the optical system disclosed herein. The method includes determining the relative coordinates of the position of the writing field relative to the position of the preview field using a method described herein. The method also includes providing the substrate on the substrate holder, and determining a writing target position on the substrate in the preview field. The method further includes displacing the writing target position from the preview field into the writing field using the determined relative coordinates. In addition, the method includes writing a predetermined structure into the writing field using the writing light beam. Such a method for producing lithographic structures uses the advantages of determining the relative coordinates with the aid of the explained optical system.

The writing target position can be aligned in the preview field before the writing target position is displaced from the preview field into the writing field. Such aligning of the writing target position in the preview field facilitates an optimized use of positioning components when writing the predetermined structure into the writing field.

BRIEF DESCRIPTION OF THE DRAWINGS

An exemplary embodiment of the disclosure is explained in greater detail below with reference to the drawings, in which.

DETAILED DESCRIPTION

Figure 1:
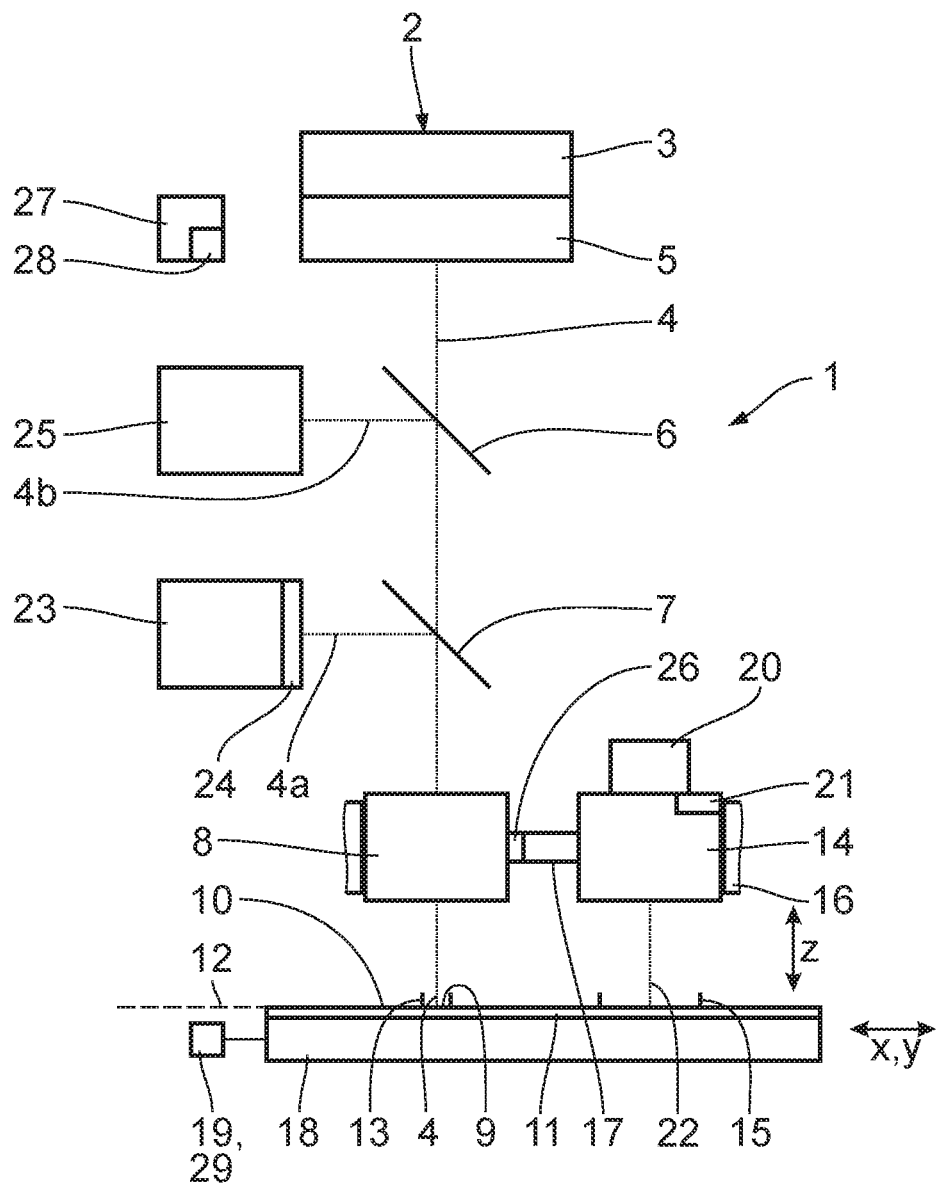
FIG. 1 shows a schematic side view of principal components of an optical system for producing lithographic structures.

An optical system 1, the principal components of which are depicted in FIG. 1, serves to produce lithographic structures. A structure production method which may be carried out using the optical system 1 is explained in a more detailed fashion in U.S. 2013/0 221 550 A1. Details of a product which emerges as a result of producing the structures are described in U.S. 2013/0 223 788 A1.

A lithography system 2 including a light source 3 for producing a beam of writing light 4 is part of the optical system 1. A beam path of the writing light 4 is depicted very schematically by way of a dotted line in FIG. 1. The light source 3 may be a pulsed NIR (near-infrared) laser with a wavelength of 780 nm; details thereof are likewise specified in U.S. 2003/0 221 550 A1.

A deflection device 5 for the writing light beam is part of the lithography system 2. The deflection device 5 may include one or more tiltable scanning mirrors for deflecting the writing light beam. The deflection device 5 may contain at least one optical component which is embodied as a micro-electromechanical system (MEMS) component.

Figure 2:
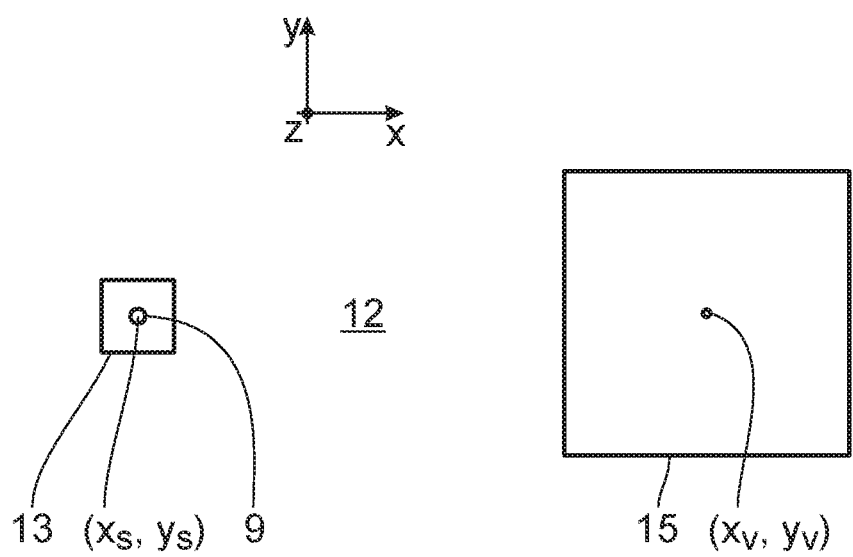
FIG. 2 likewise schematically shows, in a top view, a preview field of a preview optical unit of the optical system and, spaced apart therefrom, a writing field in which a writing focus of a projection optical unit of the optical system is arranged.

The beam of the writing light 4 passes through two output coupling mirrors 6 and 7 along its path after the light source 3, the output coupling mirrors being arranged in succession in the beam path of the writing light 4. Subsequently, the writing light 4 passes through a projection optical unit 8 in the form of a microscope objective or in the form of a lithography lens. The projection optical unit 8 serves to guide the structure-producing writing light beam into a writing focus 9 (cf. FIG. 2) in the region of a substrate surface 10 of a substrate 11 in a substrate plane 12. An area within which polymerization of substrate material, used for producing structures, by way of the writing focus 9 may be brought about may have a lateral extent in the region between 1 and 100 $\mu m^2$, for example between 2 and 10 $\mu m^2$. The writing focus 9 may be approximately round, but it may also have an x/y-aspect ratio which deviates significantly from 1 and may, for example, have a lateral extent in the region of 1 $\mu m \times 10$ $\mu m$.

A structure is produced by displacing the writing focus 9 relative to the substrate material. The produced structure emerges as a sum of a plurality or multiplicity of polymerized point regions or polymerized lines. A typical structure of this type may, for example, have a lateral extent in the region of 5 $\mu m \times 200$ $\mu m$. The point region in which the polymerization occurs is a volume pixel, i.e. a voxel. The projection optical unit 8 has an image-side numerical aperture which is greater than 0.5 and which is greater than 1.0 in the exemplary embodiment and, for example, lies in the range between 1.2 and 1.4.

The deflection device 5 serves to deflect the writing focus 9 of the writing light beam within a writing field 13 in the substrate plane 12 in the region of the substrate surface 10. A structure may be produced with the aid of the writing focus 9 within the entire writing field 13. To this end, the writing focus 9 may be moved, in particular scanned, within the writing field 13. Thus, a produced structure may be significantly larger than the extent of the writing focus 9.

In the writing focus 9, the structure may be produced by way of a single photon process or else by way of a multiphoton process.

The optical system 1 furthermore includes a preview optical unit 14 for imaging a preview field 15 (cf., once again, FIG. 2) in the substrate plane 12 in the region of the substrate surface 10. The preview field 15 has an area which is greater than an area of the writing field 13 by at least a factor of 10. The preview field 15 may be larger than the area of the writing field 13 by at least a factor of 100.

In FIG. 1, the fields 13, 15 are not reproduced true to scale.

A Cartesian xyz-coordinate system is used below for the purposes of elucidating positional relationships between the structure elements of the optical system 1. In the side view according to FIG. 1, the xy-plane is perpendicular to the plane of the drawing and coincides with the substrate plane 12. The z-direction is perpendicular thereto and extends upward in FIG. 1. Thus, an extent of the fields 13, 15 and a position of the writing focus 9 may be specified by x,y-coordinates.

The writing field 13 has an xy-extent with a typical edge length in the range between 100 $\mu m$ and 1 mm, for example an extent of 400 $\mu m \times 400$ $\mu m$. A focal diameter of the writing focus 9 in a focal plane of the writing light beam lies in a range between 0.25 $\mu m$ and 50 $\mu m$. A typical focal diameter of the writing focus 9 lies at 1 $\mu m$. Thus, the writing field 13 is typically greater than the diameter of the writing focus 9 by more than a factor of 100 along each one of the two coordinates x and y.

The preview field 15 has an extent with a typical edge length of between 1 mm and 50 mm, for example a typical xy-extent of 10 mm×10 mm. The preview field 15 may be even larger and have a typical xy-extent of, for example, 50 mm×50 mm. The preview field 15 is smaller than the overall substrate surface 10 which, for example, may have an area of 20×20 $cm^2$. The substrate 11 may be rectangular or round. The area of the round substrate is typically smaller than that of the rectangular substrate by a factor of 0.75.

The preview optical unit 14 magnifies the preview field 15 with a magnification in the range between 5 and 100, typically between 30 and 40. A working distance between a component of the preview optical unit 14 closest to the substrate and the substrate 10 lies in the range between 1 mm and 30 mm and is typically 10 mm.

The preview optical unit 14 has an image-side numerical aperture which is less than 0.1 and which may, for example, be 0.05.

The projection optical unit 8 and the preview optical unit 14 are carried by a common frame 16 which is indicated schematically and in a cutaway form in FIG. 1. The projection optical unit 8 or the preview optical unit 14 are rigidly connected to one another by way of a frame carrier 17 in relation to the coordinates x and y.

The substrate 11 is carried by a substrate holder 18. The latter is displaceable in the xy-plane in the two degrees of translational freedom x and y. To this end, the substrate holder 18 is connected to an xy-displacement drive 19. The substrate holder 18 with the xy-displacement drive 19 may be embodied as an xy-stage with a positioning repetition accuracy of better than 5 $\mu m$.

The preview optical unit 14 includes a CCD camera 20 for the purposes of detecting the preview field 15. Alternatively, or additionally, the preview optical unit 14 may include a tube for visual inspection by an operating person. The preview field 15 is illuminated by way of a preview light source 21, which is integrated into the preview optical unit 14 and independent of the light source 3 of the writing light. The preview light source 21 produces preview light 22 for illuminating the preview field 15. The beam path of the preview light 22 is likewise indicated very schematically by way of a dotted line in FIG. 1. The preview light source 21 may be a light source in the visible wavelength range. Alternatively, it is also possible, as a matter of principle, to use the light source 3 of the writing light for producing preview light for illuminating the preview field 15.

The preview light source may bring about a wide-field illumination and/or a structured illumination. Here, use may be made of a speckle pattern or else of a stripe projection.

The optical system 1 furthermore includes a process camera 23 for capturing the writing field 13. This is carried out using a separate illumination of the writing field, which is not depicted in any more detail in the drawing. Alternatively, or additionally, the beam path of the writing light beam in the projection optical unit 8 may be used for capturing part of the writing field 13 in any case. Light having undergone retroreflection from the writing field 13 into the projection optical unit 8, e.g. the writing light 4, is decoupled into the process camera 23 from a semitransparent output coupling mirror 7. The process camera 23 includes a CCD chip 24 for capturing the light 4*a* decoupled by way of the output coupling mirror 7. Provided that illumination which is independent of the light source of the writing light is used for capturing the writing field 13, it is nevertheless also possible to additionally capture the writing light 4 by way of the process camera 23.

Furthermore, the optical system 1 includes an autofocusing device 25 for determining a focal plane of the projection optical unit 8 and/or of the preview optical unit 14. Here, the autofocusing device 25 captures a further light beam 4*b* which was decoupled by the semitransparent output coupling mirror 6. The autofocusing device 25 may include a dedicated illumination, which is not depicted in any more detail in the drawing.

The projection optical unit 8 is displaceable relative to the preview optical unit 14 in the z-direction, i.e. perpendicular to the substrate plane 12. To this end, the projection optical unit 8 is equipped with a z-displacement drive 26. The z-displacement drive 26 is indicated schematically in FIG. 1 and arranged between the frame carrier 17 and the projection optical unit 8. In the case of this z-displacement of the projection optical unit 8 relative to the preview optical unit 14, a relative movement of the two optical units 8, 14 with respect to one another is guided by way of a z-guide. This z-guide is part of the frame carrier 17.

The focal planes of the projection optical unit 8 and of the preview optical unit 14 may be adjusted with the aid of the z-displacement drive 26.

The optical system 1 furthermore includes a control unit 27. The control unit 27 includes a memory 28, in which relative coordinates ($RK_x$, $RK_y$) of the position of the writing field 13 relative to the position of the preview field 15 are stored.

With the aid of the optical system 1, it is possible to produce microstructures and/or nanostructures by way of lithography. This may occur in a mask-free manner, i.e. without imaging an object structure onto the substrate surface 10, but alternatively also in a mask-based manner.

For the purposes of determining the relative coordinates $RK_x$, $RK_y$ of the position of the writing field 13 relative to the position of the preview field 15, the following is carried out:

Initially, a test object, for example a rectangular structure with a predetermined x/y-aspect ratio, is recorded using the preview optical unit 14. The position of the test object in the preview field 15 is captured via the CCD camera 20. Subsequently, the test object is positioned in the preview field 15 with the aid of the xy-displacement drive 19 such that the test object has a defined position in the preview field 15. By way of example, this position may be selected in such a way that a mark on the test object comes to rest on the central coordinates $x_v$, $y_v$ (cf. FIG. 2) of the preview field 15.

At the same time, a regulated actuation of the z-displacement drive 26 renders it possible to ensure that the test object lies ideally in an image-side focal plane of the preview optical unit 14.

Subsequently, the test object is coarsely displaced between the preview field 15 and the writing field 13 on the substrate holder 18 with the aid of the xy-displacement drive 19. During this coarse displacement, coarse relative coordinates $RK_{x,\,coarse}$; $RK_{y,\,coarse}$ are registered and stored in the memory 28. The goal of the coarse displacement is to displace the test object into the writing field 13.

Subsequently, the test object is recorded with the projection optical unit 8 and the process camera 23. Subsequently, the test object is finely positioned in the writing field 13 until the test object has a defined position in the writing field 13. By way of example, this defined position may be such that the mark of the test object corresponds to a center $x_s$, $y_s$ (cf. FIG. 2) of the writing field 13 after fine positioning has been carried out in the writing field 13. The changes of the coarse relative coordinates of the test object during the fine positioning are also registered and stored in the memory 28. Then, the desired relative coordinates of the position of the writing field 13 relative to the position of the preview field 15 may be registered from the coarse relative coordinates and the registered changes during the fine positioning, and the desired relative coordinates may be stored in the memory 28. In the example according to FIG. 2, the following relationship emerges between the relative coordinates $RK_x$, $RK_y$ and the coordinates $x_v$, $y_v$ and $x_s$, $y_s$ of the fields 15 and 13:

$$RK_x, RK_y = (x_v - x_s), (y_v - y_s)$$

The produced relative coordinates $RK_x$, $RK_y$ are then stored in the memory 28 of the control unit 27 and are available for a subsequent recall when displacing a substrate, on which a structure should be produced by way of lithography, into a writing target position.

The preview optical unit 14 is calibrated relative to the position optical unit 8 once the relative coordinates $RK_x$, $RK_y$ were determined. A displacement of the substrate holder 18 by the coordinates ($RK_x$, $RK_y$) transfers an object carried by the substrate holder from the center of the preview field 15 to the center of the writing field 13.

If the extent to the preview field 15 is known, it is also possible to directly convert a user-selected position in the preview field 15 to a center in the writing field 13. This is carried out by virtue of the control unit 27 initially centering this selected position in the preview field 15, which is carried out by appropriate positioning by way of the xy-displacement drive 19 and registering of corresponding relative coordinates. Subsequently, the transfer displacement described above is carried out. The centration and the transfer displacement may also be combined within one step.

Alternatively, the determination method described above may also be carried out proceeding from a recording of the test object in the writing field 13, wherein the test object in that case is initially positioned in the writing field 13 and there subsequently is a coarse displacement of the test object from the writing field 13 to the preview field 15 with corresponding fine positioning within the preview field 15. Registering of, initially, the coarse relative coordinates and the production therefrom and the result of the fine positioning of the desired relative coordinates is then carried out in a manner analogous to what was already explained above in the context of the determination method proceeding from the test object in the preview field 15.

Depending on the sequence of positioning of the test object, the initial field is therefore either the preview field 15 or the writing field 13, and the target field is either the writing field 13 or the preview field 15.

During the fine positioning, the correlation of the positions of the test object in the initial field on the one hand and in the the target field on the other hand is maximized. This maximization of the correlation is carried out by rotating the test object and/or compressing the test object and/or displacing the test object.

The rotation is carried out about an axis parallel to the z-axis, which may be carried out by an additional pivoting motor 29 of the substrate holder 18. As an alternative, a rotation may also occur by way of an image rotation of the respective capturing optical unit during the display for the user. A plurality of marks are applied at various x,y-positions of the test object for the purposes of capturing such a rotation. After the coarse displacement, or during the fine positioning, a rotation may maximize a correspondence of these test marks with target marks.

During compression, an imaging scale ratio between the projection optical unit 8 and the preview optical unit 14 is varied by way of the z-displacement drive 26 until a predetermined ratio corresponds with a distance ratio of test marks on the test object when recording by way of the preview optical unit 14 on the one hand and by way of the projection optical unit 8 on the other hand.

Maximizing the correlation by displacement, i.e. by translation in the degrees of freedom x and y, was already explained above in conjunction with FIG. 2.

An image stack may be produced during the test object recording by way of recording various images of the test object with the respective recording optical unit, i.e. with the projection optical unit 8 or the preview optical unit 14, in different z-displacement positions of this recording optical unit relative to the test object in the z-displacement direction perpendicular to the xy-substrate plane 12.

In addition to the relative coordinates along the x-coordinate and along the y-coordinate, it is also possible to store a relative coordinate in the z-direction provided there is a z-offset of the focal planes between focal planes of the projection optical unit 8 on the one hand and the preview optical unit 14 on the other hand.

When determining the relative coordinates, there may be multiple coarse displacements of the test object between the fields 13, 15. Then, the relative coordinates may be determined within the scope of an iterative process.

For the purposes of producing lithographic structures with the optical system 1, the relative coordinates of the position of the writing field 13 are initially determined relative to the position of the preview field 15, as explained above. The substrate 11 is subsequently provided on the substrate holder 18. Then, a portion provided for the structuring on the entire substrate 11 may be driven under the preview field 15 with the aid of the xy-displacement drive 19. Then, a writing target position on the substrate 11 is identified in the preview field 15 and selected by the user. This writing target position may then be aligned in the preview field 15. Subsequently, the writing target position is displaced from the preview field 15 into the writing field 13 using the determined relative coordinates $RK_x$, $RK_y$. Thereupon, a predetermined structure is written into the writing field 13 using the writing light beam, wherein the writing focus 9 is displaced in accordance with the form of the predetermined structure in the writing field 13 with the aid of the deflection device 5.

By way of example, a wafer with a diameter of approximately 15 cm (6 inches) or approximately 20 cm (8 inches) may be used as a substrate 11. A wafer with an even larger diameter may also be used.

What is claimed is:

1. A method of operating an optical system configured to produce lithographic structures, the optical unit comprising a projection optical unit, a preview optical unit and a substrate holder, the method comprising:

recording a test object using the preview optical unit or the projection optical unit in an initial field;

positioning the test object in the initial field so that the test object has a defined position in the initial field;

carrying out, via the substrate holder, a coarse displacement of the test object between the initial field and a target field;

registering coarse relative coordinates of the coarse displacement;

recording the test object using the other of the two optical units from the optical group;

finely positioning the test object in the target field so that the test object has a defined position in the target field; and registering changes in the coarse relative coordinates during the fine positioning and producing the relative coordinates from the coarse relative coordinates and the result of the registration.

2. The method of claim 1, wherein the initial field the preview field or the writing field.

3. The method of claim 2, wherein the target field is different from the initial field, and the target field is the preview field or the writing field.

4. The method of claim 1, further comprising, during the fine positioning, maximizing a correlation of the position of the test object in the initial field and in the target field.

5. The method of claim 1, further comprising, during the test object recording, producing an image stack by recording various images of the test object using the recording optical unit in various displacement positions of the recording optical unit relative to the test object in a displacement direction perpendicular to the substrate plane.

6. The method of claim 1, further comprising, during the determination, repeatedly performing a coarse displacement of the test object between the fields the field group.

7. The method of claim 1, further comprising:

determining a writing target position on the substrate in the preview field;

displacing the writing target position from the preview field into the writing field using the determined relative coordinates; and writing a predetermined structure into the writing field using the writing light beam.

8. The method of claim 7, further comprising, before the writing target position is displaced from the preview field into the writing field, aligning the writing target position in the preview field.

9. A system comprising:

one or more processing devices; and one or more machine-readable hardware storage devices comprising instructions that are executable by the one or more processing devices to perform operations comprising:

recording a test object using a preview optical unit or a projection optical unit in an initial field, the preview optical unit and the projection optical unit being optical units of an optical system configured to produce lithographic structures;

positioning the test object in the initial field so that the test object has a defined position in the initial field;

carrying out, via a substrate holder of the optical system, a coarse displacement of the test object between the initial field and a target field;

registering coarse relative coordinates of the coarse displacement;

recording the test object using the other of the two optical units from the optical group;

finely positioning the test object in the target field so that the test object has a defined position in the target field; and registering changes in the coarse relative coordinates during the fine positioning and producing the relative coordinates from the coarse relative coordinates and the result of the registration.

10. One or more non-transitory machine-readable hardware storage devices comprising instructions that are executable by one or more processing devices to perform operations comprising:

recording a test object using a preview optical unit or a projection optical unit in an initial field, the preview optical unit and the projection optical unit being optical units of an optical system configured to produce lithographic structures;

positioning the test object in the initial field so that the test object has a defined position in the initial field;

carrying out, via a substrate holder of the optical system, a coarse displacement of the test object between the initial field and a target field;

registering coarse relative coordinates of the coarse displacement;

recording the test object using the other of the two optical units from the optical group;

finely positioning the test object in the target field so that the test object has a defined position in the target field; and registering changes in the coarse relative coordinates during the fine positioning and producing the relative coordinates from the coarse relative coordinates and the result of the registration.

11. The method of claim 1, wherein the optical system comprises:

a projection optical unit configured to guide a structure-producing writing light beam into a writing focus in a region of a substrate surface in a substrate plane;

a deflection device configured to deflect the writing focus of the writing light beam within a writing field in the region of the substrate surface;

a preview optical unit configured to image a preview field in the region of the substrate surface, the preview field having an area at least 10 times greater than an area of the writing field, the projection optical unit and the preview optical unit being carried by a common frame;

a substrate holder displaceable in a plane parallel to the substrate surface with two degrees of translational freedom; and a control unit comprising a memory configured to store coordinates of a position of the writing field relative to a position of the preview field.

12. The method of claim 11, further comprising a process camera configured to capture the writing field via the beam path of the writing light beam in the projection optical unit.

13. The method of claim 11, wherein the projection optical unit is displaceable relative to the preview optical unit in a direction perpendicular to the substrate plane.

14. The method of claim 11, further comprising an autofocusing device configured to determine a focal plane of: a) the projection optical unit; and/or b) the preview optical unit.

15. The method of claim 11, wherein the projection optical unit has an image-side numerical aperture which is greater than one.

16. The method of claim 11, wherein the preview optical unit has an image-side numerical aperture which is less than 0.1.

17. The method of claim 11, further comprising a light source configured to produce writing light.

18. The method of claim 11, further comprising the common frame.

19. The method of claim 11, wherein the projection optical unit has an image-side numerical aperture which is greater than one, and the preview optical unit has an image-side numerical aperture which is less than 0.1.

20. The method of claim 12, wherein the projection optical unit has an image-side numerical aperture which is greater than one, and the preview optical unit has an image-side numerical aperture which is less than 0.1.

* * * * *

UNITED STATES PATENT AND TRADEMARK OFFICE
CERTIFICATE OF CORRECTION

| | | |
|---|---|---|
| PATENT NO. | : 10,310,385 B2 | Page 1 of 1 |
| APPLICATION NO. | : 15/994068 | |
| DATED | : June 4, 2019 | |
| INVENTOR(S) | : Philipp Huebner et al. | |

It is certified that error appears in the above-identified patent and that said Letters Patent is hereby corrected as shown below:

In the Specification

In Column 8, Line 67, Delete "the the" and insert -- the --, therefor.

In the Claims

In Column 10, Line 19, In Claim 2, after "field" insert -- is --.

Signed and Sealed this
First Day of October, 2019

Andrei Iancu
*Director of the United States Patent and Trademark Office*